(12) United States Patent
Guidry

(10) Patent No.: US 7,363,568 B2
(45) Date of Patent: Apr. 22, 2008

(54) SYSTEM AND METHOD FOR TESTING DIFFERENTIAL SIGNAL CROSSOVER USING UNDERSAMPLING

(75) Inventor: David Walker Guidry, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 697 days.

(21) Appl. No.: 10/979,981

(22) Filed: Nov. 3, 2004

(65) Prior Publication Data

US 2006/0149492 A1    Jul. 6, 2006

(51) Int. Cl.
*G06F 11/00* (2006.01)
(52) U.S. Cl. ......................... 714/745; 714/47
(58) Field of Classification Search ................ 714/736, 714/740, 745, 47; 324/765, 158.1; 327/76; 330/258
See application file for complete search history.

(56) References Cited

U.S. PATENT DOCUMENTS

| | | | |
|---|---|---|---|
| 6,016,566 A * | 1/2000 | Yoshida ...................... 714/736 |
| 6,281,699 B1 * | 8/2001 | Bishop ........................ 324/765 |
| 6,605,966 B1 * | 8/2003 | Chen et al. .................. 327/76 |
| 6,724,182 B2 * | 4/2004 | Isodono et al. .......... 324/158.1 |
| 6,981,192 B2 * | 12/2005 | Panis .......................... 714/740 |
| 7,109,797 B1 * | 9/2006 | Turvey ........................ 330/258 |

* cited by examiner

*Primary Examiner*—David Ton
(74) *Attorney, Agent, or Firm*—Yingsheng Tung; Wade James Brady, III; Frederick J. Telecky, Jr.

(57) ABSTRACT

System and method for testing differential signal crossover in high-speed electronic equipment. A preferred embodiment comprises a test circuit coupled to a device under test (DUT) and an automatic test equipment (ATE). The test circuit comprises a pair of window comparators coupled to a differential mode signal from the DUT, each window comparator configured to compare one of two signals making up the differential mode signal with a voltage boundary when enabled by an enable signal. The ATE is configured to provide clock signals to the test circuit and the DUT and to process data produced by the test circuit to determine if the differential signal crossover meets timing constraints. The test circuit uses undersampling to enable testing of high frequency signals without requiring an extremely high sampling rate.

27 Claims, 7 Drawing Sheets

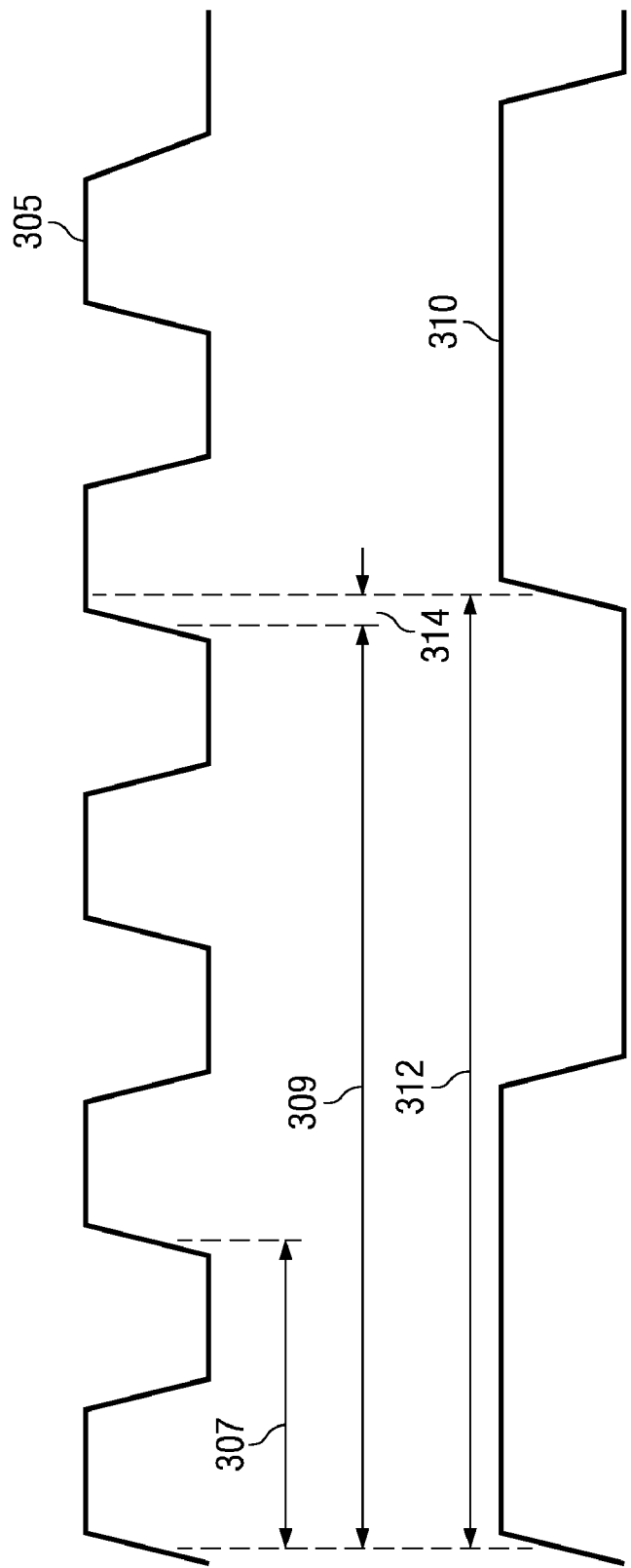

SYSTEM AND METHOD FOR TESTING DIFFERENTIAL SIGNAL CROSSOVER USING UNDERSAMPLING

TECHNICAL FIELD

The present invention relates generally to a system and method for testing electronic equipment, and more particularly to a system and method for testing differential signal crossover in high-speed electronic equipment.

BACKGROUND

Differential signaling, wherein both positive and negative versions of a signal are used to represent values being carried on the signal, is popular due to its high degree of immunity to noise and its large voltage margin. High speed electronic equipment and their interfaces, such as double data rate (DDR) and double data rate two (DDR2) memory interfaces, take advantage of differential signals to help ensure signal integrity. These signals typically have very sharp edges and very short transitions, referred to as signal crossover. Therefore, a typical automated test equipment (ATE) will lack instrumentation that is capable of measuring signal crossovers.

The Nyquist Sampling Theorem states that to accurately represent a signal, it is necessary to sample the signal at twice the signal's frequency. Therefore, one way to capture the signal crossovers is to sample the signal at a sampling rate that is twice the frequency of the signal crossover.

Another commonly used technique to enable the capture of very high frequency signals that is being generated by a device under test (DUT) is to configure the DUT so that it is producing the event that is to be tested at a specified frequency. Then, the ATE can sample the signal being produced by the DUT at a sampling frequency that is slightly different from the frequency of the event's occurrence on the signal. By sampling the signal produced by the DUT for an extended amount of time, the ATE can effectively and accurately capture the signal and the event. While the sampling frequency can either be greater than or less than the frequency of the signal, typically, the sampling frequency is less than the frequency of the signal, and hence the name, undersampling.

One disadvantage of the prior art is that in many cases, the signal crossovers can sometimes last only a few nanoseconds or less. Therefore, to sample the signal at twice this frequency may not be possible. Furthermore, if the sampling at such a sampling rate were possible, the amount of sample data produced may be very large, which could increase the complexity of the test equipment and the testing process.

A second disadvantage of the prior art is that even though the use of undersampling can enable the capture of the signal crossover, it is not capable of determining if both signals in the differential signal are within a specified voltage threshold. The undersampling of the signal can only indicate if one of the two signals (or both signals) in the differential signal is within the specified threshold, it cannot differentiate between both signals being within the specified threshold (a passing case) and only one signal being within the specified threshold (a failing case).

A third disadvantage of the prior art is that the use of undersampling cannot provide additional information about the signal crossover, such as if the signal crossover is occurring in the middle of the voltage swing of the differential signal, an approximate location of the signal crossover in the voltage swing, and so forth.

SUMMARY OF THE INVENTION

These and other problems are generally solved or circumvented, and technical advantages are generally achieved, by preferred embodiments of the present invention which provides for a system and method for testing differential signal crossover in high-speed electronic equipment.

In accordance with a preferred embodiment of the present invention, a test circuit for testing a signal crossover in a differential mode signal comprising a pair of window comparators and an enable signal line coupled to the pair of window comparators is provided. Each window comparator is coupled to a signal from a pair of signals making up the differential mode signal and is configured to compare a value of the signal with a voltage threshold boundary and produce an output value based on the comparison. The enable signal line provides an enable signal to initiate the comparison in the window comparators, wherein the enable signal is periodic with a period that is substantially equal to an integer multiple of a period of the signal crossover plus a small time value.

In accordance with another preferred embodiment of the present invention, a test system comprising a device under test (DUT), a test circuit coupled to the DUT, and an automatic test equipment (ATE) coupled to the DUT and the test circuit is provided. The test circuit comprises a pair of window comparators and an enable signal line coupled to the pair of window comparators and the ATE is configured to provide clock signals to the DUT and an enable signal to the test circuit and to process data produced by the test circuits. Each window comparator of the test circuit is coupled to a signal from a pair of signals making up the differential mode signal and is configured to compare a value of the signal with a voltage threshold boundary and produce an output value based on the comparison. The enable signal line provides an enable signal to initiate the comparison in the window comparators, wherein the enable signal is periodic with a period that is substantially equal to an integer multiple of a period of the signal crossover plus a small time value.

In accordance with another preferred embodiment of the present invention, a method for testing a circuit for meeting signal crossover timing constraints is provided. The method comprises setting an operating frequency of the circuit and a sampling frequency of an undersampling comparator, wherein the sampling frequency of the undersampling comparator is substantially equal to an integer multiple of the operating frequency of the circuit plus a small frequency value. The method further comprises setting a voltage threshold based upon a timing constraint, initiating the testing of the circuit, and counting a number of times an output of the undersampling comparator is equal to a specified value.

In accordance with another preferred embodiment of the present invention, a method for measuring a crossover voltage of a differential mode signal produced by a circuit is provided. The method comprises setting an operating frequency of the circuit and a sampling frequency of an undersampling comparator, wherein the sampling frequency of the undersampling comparator is substantially equal to an integer multiple of the operating frequency of the circuit plus a small frequency value. The method further comprises setting a voltage threshold for the undersampling comparator, counting a number of times an output of the undersampling comparator is equal to a specified value, repeating the second setting and the counting for any remaining voltage thresholds, and calculating the crossover voltage from a voltage threshold with a largest count of the number of times the output of the undersampling comparator is equal to the specified value.

An advantage of a preferred embodiment of the present invention is that a high sampling rate is not required to permit the accurate and effective capture of a signal crossover in a differential signal. Therefore, it may be possible to use less expensive test equipment that is not capable of operating at high frequencies.

A further advantage of a preferred embodiment of the present invention is that in addition to determining if a DUT passes or fails, information about the signal crossover can be determined. For example, the location of the signal crossover can be determined. Information regarding the signal crossover can provide information about electronic components used in the DUT and can possibly help determine if the electronic components are operating within specifications.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a diagram of undersampling a periodic signal;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a test fixture and test equipment for testing high-speed memory interfaces that use differential signals. The invention may also be applied, however, to test fixtures and test equipment for other electronic devices and interfaces that use differential signals.

Figure 1:
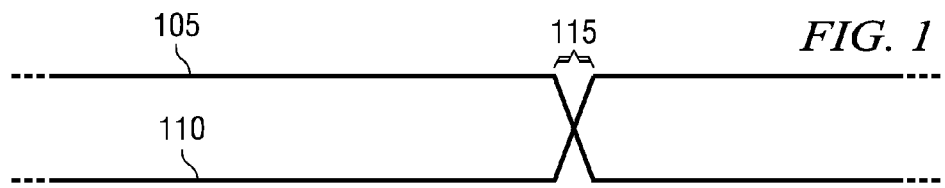
FIG. 1 is a diagram of a differential mode signal.

With reference now to FIG. 1, there is shown a diagram illustrating a differential signal (or a differential mode signal). The differential signal is represented by two signals, a first signal 105 and a second signal 110. The two signals in a differential signal are commonly referred to as a positive signal and a negative signal. The two signals are normally assigned opposite values, for example, when the first signal 105 has a high voltage value, then the second signal has a low voltage value and vice versa. The two signals normally do not share a common value, an exception being when the differential signal changes value, referred to as a signal crossover, shown in FIG. 1 as highlight 115. When a differential signal changes value, both of the two signals used to represent the differential signal must change value. Therefore, during the signal crossover 115, the two signals share a common value.

In a high-speed memory interface, such as DDR or DDR2, there may be very strict requirements on signals (for example, restrictions on signal skew), thereby, there are strict requirements on where signal crossovers occur. Therefore, a possible test of a memory device can be to test if signal crossovers are occurring at a proper location and if the signal crossover is symmetric. If there are significant timing differences in the two signals of a differential signal, then the signal crossover may not be symmetric. If the timing difference is great, then the signal crossover may occur outside of a specified voltage range or the signal crossover may not even overlap. If this is the case, then the memory device (or other electronic equipment) may not operate properly.

Testing can be performed on electronic devices to ensure that the electronic devices operate as intended and that any technical and performance requirements are met. An electronic device being tested, commonly referred to as a device under test (DUT) can be coupled to an automatic test equipment (ATE) and a variety of different tests can be applied onto the DUT by the ATE. Results of the different tests can be stored and processed by the ATE and the DUT can be declared as either having passed or failed the test(s). The ATE can vary on its testing capability and speed, with more capable and speedy ATEs being more complex and expensive.

Figure 2A:
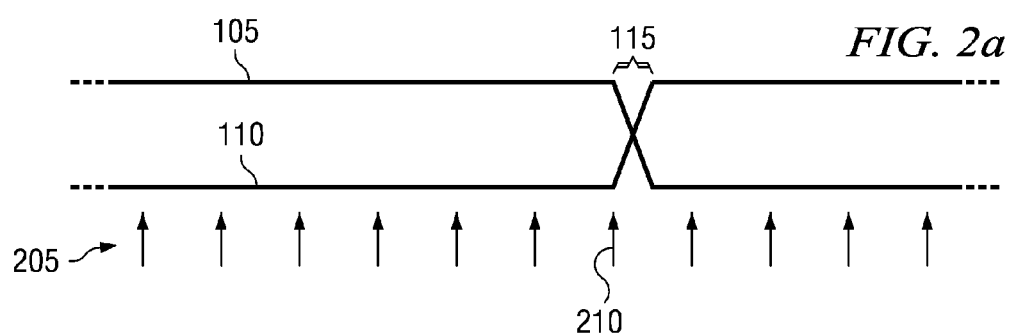
FIGS. 2a and 2b are diagrams of a signal crossover and sampling of the signal crossover at different sampling rates.
Figure 2B:
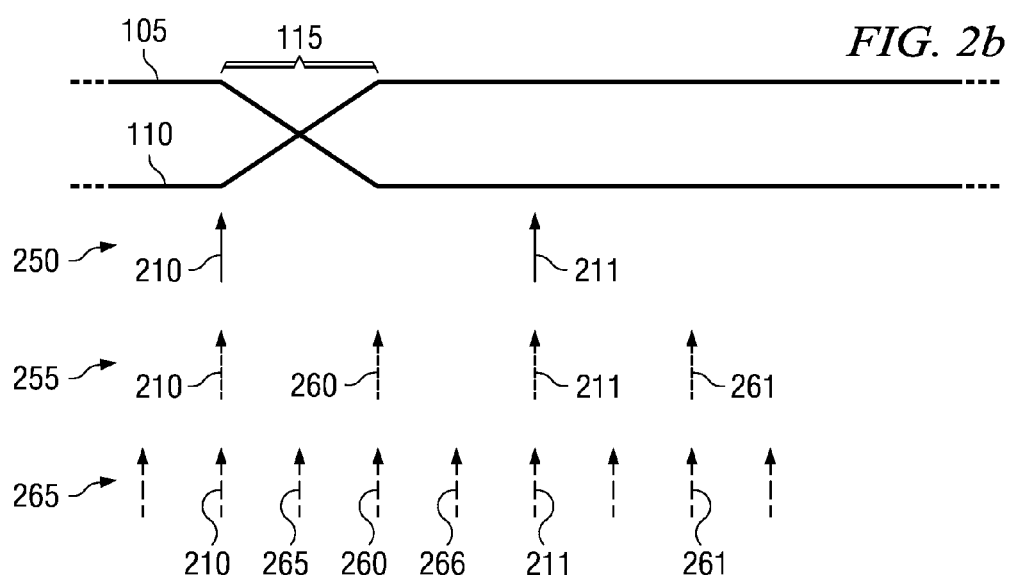

With reference now to FIGS. 2a and 2b, there are shown diagrams illustrating a signal crossover and attempts to capture the signal crossover using sampling techniques. As discussed earlier, the signal crossover can typically occur with very sharp transition. For example, technical specifications for DDR memory specify a signal crossover to occur in approximately 400 pico-seconds. Therefore, a very high sampling rate is needed to accurately capture the signal transition. FIG. 2a illustrates a typical differential mode signal comprising the first signal 105 and the second signal 110. Also shown is a stream of impulses 205 that can be illustrative of samples taken of the differential mode signal. Each impulse, such as impulse 210, indicates the taking of a sample of the two signals 105 and 110 making up the differential mode signal. Note that the sampling rate, as shown by the stream of impulses 205, is inadequate and cannot capture the signal crossover 115.

The sampling rate can be increased in an attempt to capture the signal crossover 115. FIG. 2b illustrates an expanded view of the signal crossover 115 of the differential mode signal. A first impulse stream 250, made up of solid impulses, such as impulses 210 and 211, are the same as the impulses shown in the stream of impulses 205. For discussion purposes, let the first impulse stream have a sampling rate of R. A second impulse stream 255, with a sampling rate of 2R, is made up of impulses shown as dotted impulses, such as impulses 260 and 261, as well as the impulses from the first impulse stream 250. The second impulse stream 255 has twice as many impulses as the first impulse stream. A third impulse stream 265, with sampling rate of 4R, is made up of impulses shown as dashed impulses, such as impulses 265 and 266, as well as the dotted impulses and the solid impulses. The third impulse stream has twice as many impulses as the second impulse stream and four times as many impulses as the first impulse stream. Note that even with a sampling rate that is four times that of the first impulse stream, the third impulse stream 265 can still have trouble capturing the true nature of the signal crossover 115, especially if the signal crossover 115 is shifted slightly in time. Clearly, direct sampling of the differential mode signal is not an effective way of capturing the nature of the signal crossover 115.

With reference now to FIG. 3, there is shown a timing diagram illustrating one signal in a pair of signals making up a differential mode signal and a signal representing a sampling clock, wherein undersampling of the differential mode signal is shown. A first signal 305 (shown in FIG. 3) displays one of a pair of signals making up a differential mode signal. Since the pair of signals making up a differential mode signal are essentially out-of-phase versions of each other, only one of the signals making up the differential mode signal is shown in FIG. 3 to help prevent confusion. A second signal 310 may represent a clock signal that can be used to set a timing for a sampling device. For example, on rising edges of the second signal 310, the sampling device can take a sample of the first signal 305 (as well as another signal representing the differential mode signal).

In order to perform testing, the DUT may need to be configured to enter a test mode, which can have the DUT operate in a loop-type mode and periodically produce a signal crossover (or a series of signal crossovers) to be tested, for example. The first signal 305 can then have a periodicity with a period, referred to as $T_{DUT}$, shown as a first interval 307 and over several periods of the first signal 305, the first signal 305 can have a period, referred to as $N*T_{DUT}$, shown as a second interval 309, wherein N is the number of periods. The second signal 310 can also be periodic with a period $T_{SAMPLE}$. Note that as shown in FIG. 3, the periods of the first signal 305 and the second signal 310 are shown referenced to rising edges of the first signal 305 and the second signal 310. However, the periods can also be reference to falling edges, level midpoints, and so forth without affecting the discussion.

If the period of the sampling, $T_{SAMPLE}$ (the period of the second signal 310), was equal to either the period of the first signal 305, $T_{DUT}$, or an integer multiple of the period of the first signal 305, $N*T_{DUT}$, then the sampling would occur at substantially the same point in the first signal 305. However, if the period of the sampling was slightly longer (or shorter) than either the period of the first signal 305 or an integer multiple period of the first signal, shown as interval 314, then each sample taken would move slightly along the first signal 305, and if a sufficient number of samples are taken, then it can be possible to reconstruct the first signal 305 out of samples taken from various periods of the first signal 305. For example, if $T_{SAMPLE}=N*T_{DUT}+\Delta t$, then a first sample taken of the first signal can occur $\Delta t$ time units after a period reference point, a second sample taken can occur $2*\Delta t$ time units after a period reference point, a third sample taken can occur $3*\Delta t$ time units after a period reference point, and so forth. Note that the sampling period, TSAMPLE, can be either $\Delta t$ shorter or $\Delta t$ longer than an integer multiple of a period of the first signal 305. In order to obtain a good representation of the first signal 305, $\Delta t$ should be much smaller than $T_{DUT}$. For example, if $T_{DUT}$ is on the order of 100 nano-seconds, then $\Delta t$ should be on the order of one or two nano-seconds. This method of sampling a signal by sampling at a rate that is less than the required Nyquist rate is referred to as undersampling.

Figure 4:
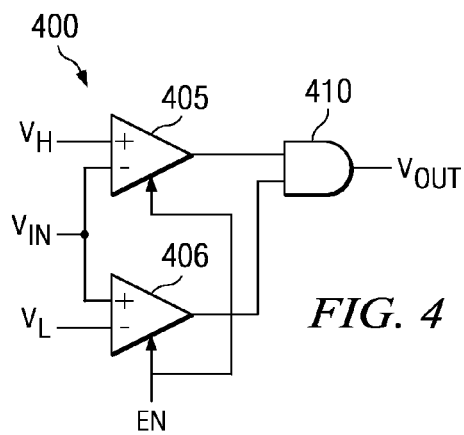
FIG. 4 is a diagram of a window comparator.

With reference now to FIG. 4, there is shown a diagram illustrating a window comparator 400. The window comparator 400 is a high-speed comparator that is widely used in test equipment. The window comparator 400 determines if an input signal, $V_{IN}$, lies within (or without) a specified window. The specified window can be specified by a pair of boundaries, $V_H$ and $V_L$, which are high and low voltage boundaries of the specified window, respectively. The window comparator 400 can produce a certain output if the input signal, $V_{IN}$, lies within the specified window, else it produces a different output.

The window comparator 400 can be built out of a pair of two-input signal comparators 405 and 406 and an AND gate 410. The high voltage boundary, $V_H$, and the input signal, $V_{IN}$, can be inputs to one two-input signal comparator while the low voltage boundary, $V_L$, and the input signal, $V_{IN}$, can be inputs to another two-input signal comparator. For example, the high voltage boundary, $V_H$, can be provided to a positive input of the two-input signal comparator 405, the input signal, $V_{IN}$, can be provided to a negative input of the two-input signal comparator 405 and a positive input of the two-input signal comparator 406, and the low voltage boundary, $V_L$, can be provided to a negative input of the two-input signal comparator 406. As configured, the two-input signal comparator 405 can produce a true signal if the input signal, $V_{IN}$, is less than the high voltage boundary, $V_H$, and the two-input signal comparator 406 can produce a true signal if the input signal, $V_{IN}$, is greater than the low voltage boundary, $V_L$. An enable signal "EN" can be used to gate the operation of the two two-input signal comparators 405 and 406, wherein when the enable signal "EN" is active, the two two-signal comparators can perform the comparison of signal values at their inputs and produce a corresponding output.

Outputs from the two two-input signal comparators 405 and 406 can then be provided to the AND gate 410. The AND gate 410 can combine the outputs from the two two-input signal comparators 405 and 406 and produces a true signal if both outputs are true, i.e., the input signal, $V_{IN}$, is less than the high voltage boundary, $V_H$, and is greater than the low voltage boundary, $V_L$. If either (or both) of the outputs of the two two-input signal comparators 405 and 406 are false, then the AND gate 410 produces a false signal output.

Typically, a technical specification for a signal crossover, such as those in the specifications for high-speed memory devices such as DDR and DDR2 compliant high-speed memory devices, would specify a range or interval wherein the pair of signals making up the differential mode signal must switch values. For example, the technical specifications may specify that a signal crossover must occur within a certain amount of time plus or minus a small time interval. It is therefore possible to use the window comparator 400 to determine if a signal crossover is occurring within the permitted time interval, since the permitted time interval can be directly related to a voltage interval, which can be used by the window comparator 400.

Figure 5A:
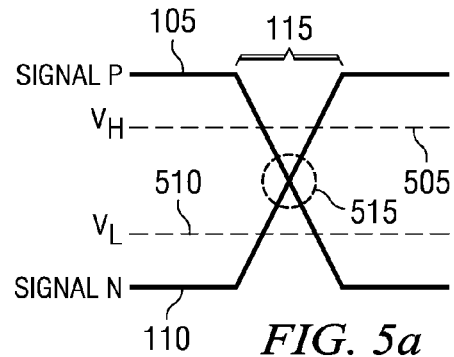
FIGS. 5a through 5e are diagrams of signal crossovers switching at differing times and how voltage threshold boundaries can be used to determine if timing constraints are met, according to a preferred embodiment of the present invention.

With reference now to FIGS. 5a through 5e, there are shown diagrams illustrating multiple signal crossovers wherein a pair of signals making up a differential mode signal switches at differing times and how a voltage interval can be used to determine the adherence of the multiple signal crossovers to a technical specification, according to a preferred embodiment of the present invention. With reference to FIG. 5a there is shown a pair of signals 105 and 110 making up the differential mode signal. A pair of dashed lines 505 and 510 correspond to a voltage interval that can be directly related to a time interval used to define a valid signal crossover. For example, if the time interval for a valid signal crossover is specified to be two (2) nano-seconds and a signal can switch in five (5) nano-seconds with a three (3) volt voltage swing (from 0.0 volts to 3.0 volts), then the pair of dashed lines 505 and 510 can be located at 2.1 volts and 0.9 volts, respectively.

As shown in FIG. 5a, both signals in the pair of signals 105 and 110 switch values at substantially the same time, shown as signal crossover 115. Since both signals switch at substantially the same time, a voltage corresponding to when both signals have the same voltage value (shown as highlight 515) occurs when the value of both signals is at approximately the middle of the signal voltage swing. Since the voltage corresponding to when both signals have a common value lies in between the pair of dashed lines 505 and 510, the signal crossover 115 can be deemed to be a valid signal crossover and a device that generated the pair of signals has passed the test.

Figure 5B:
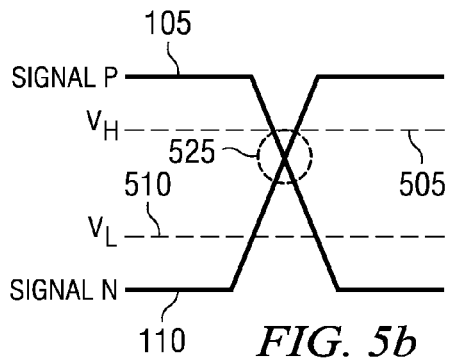
Figure 5C:
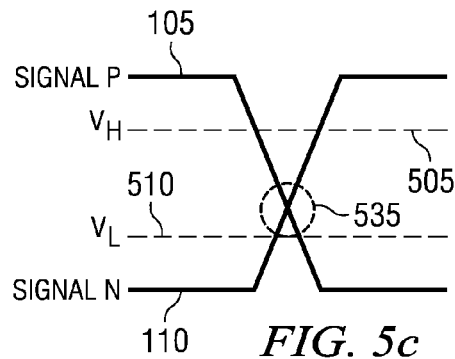

When the signals making up the differential mode signal switches at different times, a voltage that corresponds to when the signals have the same voltage value no longer occurs in the middle of the voltage swing. In such a situation, then it may be possible that the voltage lies outside of a boundary specified by the pair of dashed lines 505 and 510. When this occurs, the device has failed the test. With reference to FIG. 5b, a voltage that corresponds to when the signals have the same voltage value (shown as highlight 525) is above the middle of the voltage swing. This can occur when the signal 105 switches after the signal 110. However, since the signal 105 switches within the permitted time interval, the voltage corresponding to when the signals have the same voltage value (highlight 525) is still within the pair of dashed lines 505 and 510. Similarly, FIG. 5c displays a situation when the signal 105 switches before the signal 110, but within the permitted time interval. In this situation, a voltage corresponding to when the signals have the same voltage value (shown as highlight 535) is below the middle of the voltage swing but still within the boundary specified by the pair of dashed lines 505 and 510.

Figure 5D:
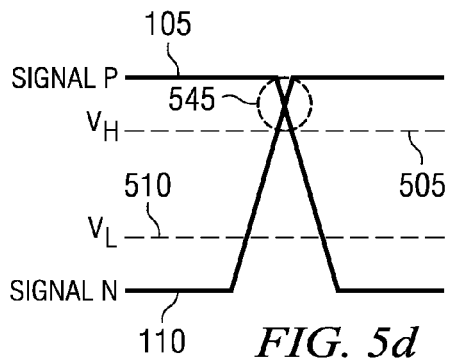
Figure 5E:
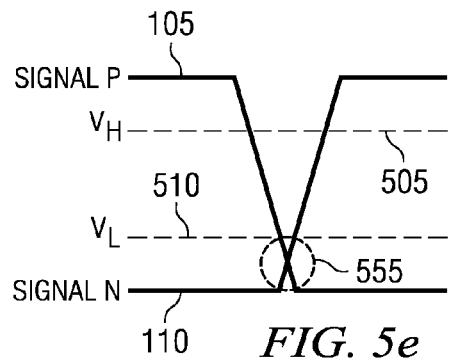

With reference to FIGS. 5d and 5e, situations are shown wherein the signal 105 switches after the signal 110 (FIG. 5d) and before the signal 110 (FIG. 5e). However, in both situations, the signal 105 switches outside of the permitted time interval. Therefore, a voltage corresponding to when the signals have the same voltage value (shown as highlight 545 in FIG. 5d and as highlight 555 in FIG. 5e) lie outside of the boundary specified by the pair of dashed lines 505 and 510. Since the voltages lay outside of the boundary specified by the pair of dashed lines 505 and 510, the device has failed the test. An additional situation that can arise when one of the signals (signal 105 or 110) switches completely before the other signal (signal 110 or 105) begins to switch. In such a situation, there may not be a voltage corresponding to when the signals have the same voltage value or the voltage value may be equal to one of the voltage rails. In this situation, the voltage value lies outside of the boundary specified by the pair of dashed lines 505 and 510.

Figure 6:
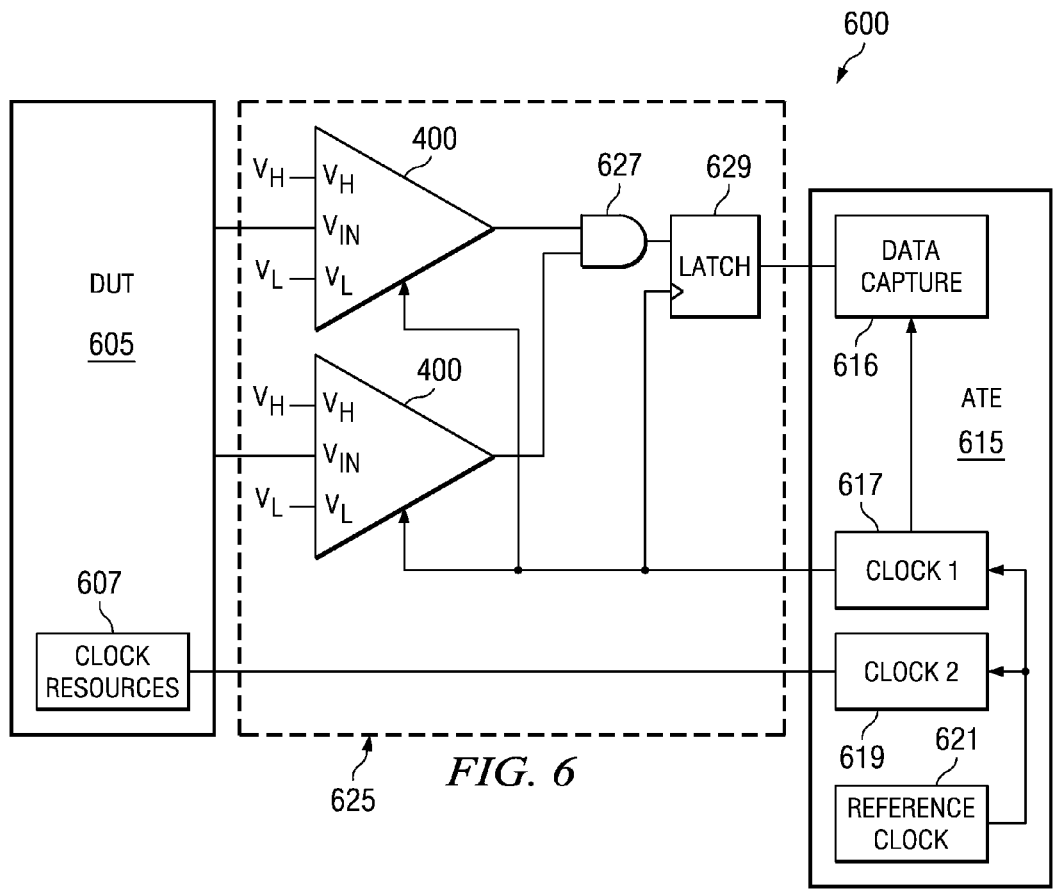
FIG. 6 is a diagram of a test system for testing differential mode signals, according to a preferred embodiment of the present invention.

With reference now to FIG. 6, there is shown a diagram illustrating a test system 600 for use in testing differential mode signals in an electronic device, according to a preferred embodiment of the present invention. The test system can be logically partitioned into three distinct units: a device under test (DUT) 605, an automatic test equipment (ATE) 615, and a test board 625. The DUT 605 can be a circuit board that can be used to hold the electronic device being tested or it can be the electronic device itself. In many instances, the electronic device being tested needs to be placed in a test fixture (not shown) prior to testing. The test fixture may contain necessary electrical contacts, power supplies, configuration hardware, clocks, and so forth. However, it may be possible that the electronic device being tested has built-in all necessary hardware and software to support testing and can be tested without needing a test fixture. The ATE 615 can contain necessary measurement equipment, data capture equipment, data processing equipment, power supplies, clocks, and so forth. The ATE 615 can operate as a controller that can be used to put the DUT 605 through various tests and monitors the behavior of the DUT 605 as it undergoes the testing. The ATE 615 can provide a final determination if the DUT 605 passes or fails testing. For certain types of testing, the ATE 615 can be as simple as a computer with data capture hardware, while for more complex testing, the ATE 615 can be a large array of equipment costing hundreds of thousands of dollars.

The test board 625 can function as an interface between the DUT 605 and the ATE 615. The test board 625 can serve as a signal and data conduit between the DUT 605 and the ATE 615 as well as serving to perform some testing that perhaps the ATE 615 is incapable of performing. Rather than including functionality in the ATE 615 for tests that may not be used a majority of the time, the functionality can be implemented on the test board 625 as needed and usually at a lower cost. For example, if the ATE 615 is incapable of performing a certain test, the test board 625 can contain circuitry needed to perform the needed task. According to a preferred embodiment of the present invention, the test board 625 contains an undersampling signal crossover sampler to facilitate the testing of high-speed differential mode signal operation in electronic devices such as high-speed memory modules. The test system 600 may include other hardware, such as interference shielding cages and so on, that is not shown to help maintain simplicity.

The test board 625, configured with an undersampling signal crossover sampler includes a pair of window comparators 400, an AND gate 627, and a latch 629. Note that other logic gates and/or logic blocks can be used in place of the AND gate 627 without changing the spirit of the present invention. For example, a NAND gate can be used in place of the AND gate 627 or even a NOR gate and an inverter combination may be used. The window comparators 400 can implemented as discussed in FIG. 4. The two window comparators 400 can be used to determine if the pair of signals making up the differential mode signal is within a voltage boundary specified by a pair of threshold voltages, $V_H$ and $V_L$. Note that the pair of threshold voltages may be the same for each of the two window comparators 400 or they may be different, depending upon the test being run.

The AND gate 627 (or some other substitute logic block) can be used to combine outputs from the two window comparators 400 into a single signal that can indicate if the pair of signals making up the differential mode signal are both within the voltage boundary specified by the pair of threshold voltages at a time corresponding to when the sample was taken. If both signals in the pair of signals are within the voltage boundary, then the AND gate 627 can produce a signal indicating that both signals are within the voltage boundary, e.g., the signal crossover is within specifications. The latch 629 can be used to hold the value produced by the AND gate 627 and to prevent any chatter, jitter, ringing, or any other irregularities from propagating onto the ATE 615. According to a preferred embodiment of the present invention, a D flip flop can be used as the latch 629. Output from the latch 629 can be provided to the ATE 615, wherein data capture equipment 616 can capture the data carried on the output of the latch 629. The data capture equipment 616 can perform an analog or a digital capture on the data, with the digital capture being preferred. The captured data can be saved for later processing or it may be immediately processed. For example, if the test being performed on the DUT 605 is a simple pass/fail test, then the presence of several logic true values on the output of the latch 629 can be sufficient to indicate that the DUT 605 has passed. A transmission line (not shown) can be used to couple the output of the latch 629 to the ATE 615 and the data capture equipment 616.

The DUT 605 and the test board 625 can make use of clock signals produced by the ATE 615. According to a preferred embodiment of the present invention, the ATE 615 can produce several clock signals that can be used by the DUT 605 and the test board 625. The ATE 615 can produce a first clock signal "CLOCK 1" (from clock 1 block 617) that can be used to control the timing operation of the window comparators 400 and the latch 629 in the test board 625 as well as provide clocking information to the data capture equipment 616. The ATE 615 can also produce a second clock signal "CLOCK 2" (from clock 2 block 619) that can be used to provide clocking information to a clock resource block 607 in the DUT 605. The clock resource block 607 can be used to derive any needed clock signals for the proper operation of the DUT 605 based upon the clock signal provided by the ATE 615. For example, to support undersampling, the first clock signal "CLOCK 1" should be an integer multiple of the second clock signal "CLOCK 2" plus or minus a small time difference, $\Delta t$. Refer to an earlier description of undersampling for a more in depth discussion.

The ATE 615 can also have a reference clock 621 that can be used to maintain a specified level of synchrony between the first clock signal "CLOCK 1" and the second clock signal "CLOCK 2." A signal produced by the reference clock 621 can be used by clock generating circuitry (not shown) to help prevent a frequency drift from occurring between the first clock signal and the second clock signal. The use of a reference clock is considered to be well understood by those of ordinary skill in the art of the present invention and will not be discussed in additional detail.

Figure 7:
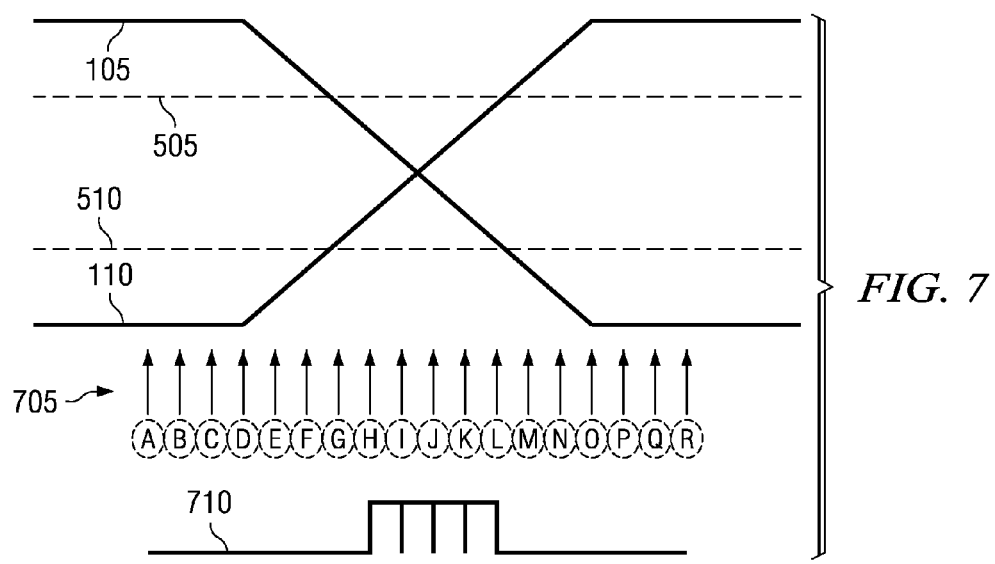
FIG. 7 is a diagram of undersampling of an exemplary signal crossover with corresponding output signal from a test board, according to a preferred embodiment of the present invention.

With reference now to FIG. 7, there is shown a diagram illustrating the undersampling of an exemplary signal crossover of a DUT and a corresponding output signal from a test board from a test system such as shown in FIG. 6, according to a preferred embodiment of the present invention. FIG. 7 displays a portion of a differential mode signal containing a signal crossover, the differential mode signal is produced by a DUT. The differential mode signal comprises the pair of signals 105 and 110. The pair of dashed lines 505 and 510 represents an upper and a lower voltage boundary, which may be directly related to timing constraints placed upon the signal crossover. A sequence of impulses 705 represents sampling instances in time, with each impulse representing a generation of samples of the pair signals 105 and 110. Note that the figure does not accurately represent what is actually occurring in the test system. In the test system, the DUT is placed in a test mode and is programmed to periodically produce the signal crossover and each impulse in the sequence of impulses 705 samples the differential mode signal at a different period of the differential mode signal. For example, if a first impulse (labeled A) occurs at a time T, then a second impulse (labeled B) occurs at time $T+N*T_{DUT}+\Delta t$, wherein $T_{DUT}$ is a period of the signal crossover, N is an integer number, and $\Delta t$ is time difference between $T_{DUT}$ and a period of the impulses. Therefore, the figure displays the pair of signals 105 and 110 and the sequence of impulses modulo the period of the signal crossover. Hence, the $\Delta t$ is effectively the separation between the impulses.

A sequence of data pulses 710 represents a latched output of a logical ANDing of outputs from window comparators (for example, the window comparators 400 (FIG. 6)), such as from the latch 629 (FIG. 6). As discussed previously, the output of the latch 629 has a logic true value when the outputs of both of the window comparators 400 are also logic true values. The outputs of the two window comparators 400 are true only when both signals in the pair of signals 105 and 110 are within the boundaries specified by the dashed lines 505 and 510. As shown in FIG. 7, the sequence of data pulses 710 have logic true values corresponding to impulses labeled H, I, J, and K. Note that the number of data pulses having logic true values can differ depending on the values of the dashed pair of lines 505 and 510, the value of $\Delta t$ (the separation between impulses), a timing of the signal crossover between the pair of signals 105 and 110, and so forth.

Figure 8A:
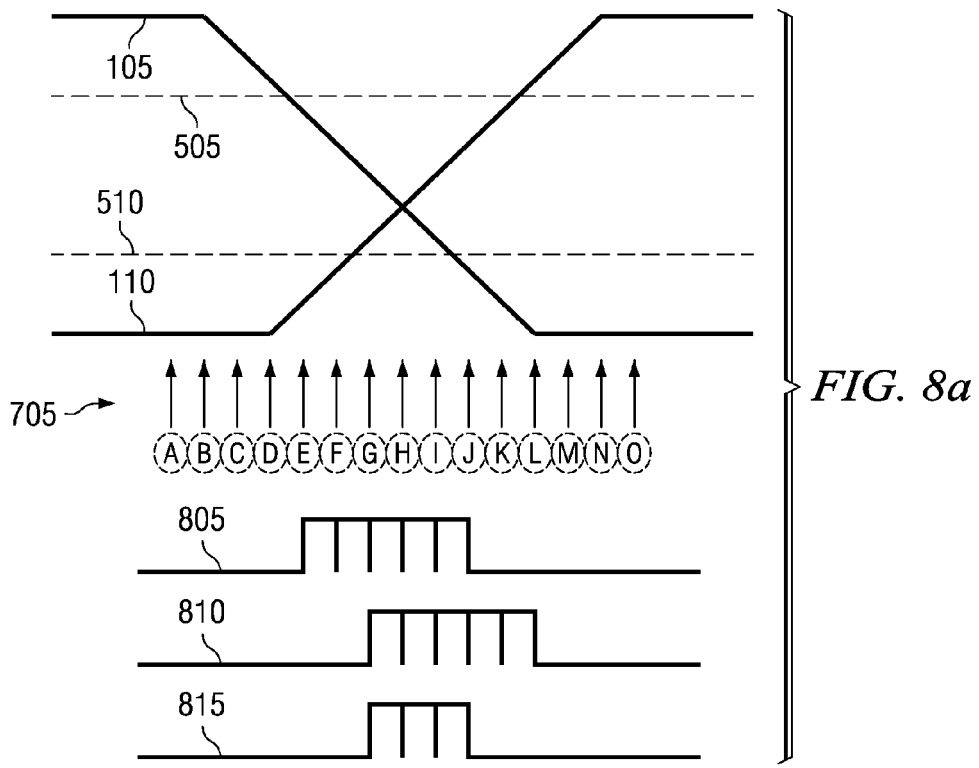
FIGS. 8a and 8b are diagrams of the effect of timing differences on output signals from a test board, according to a preferred embodiment of the present invention.
Figure 8B:
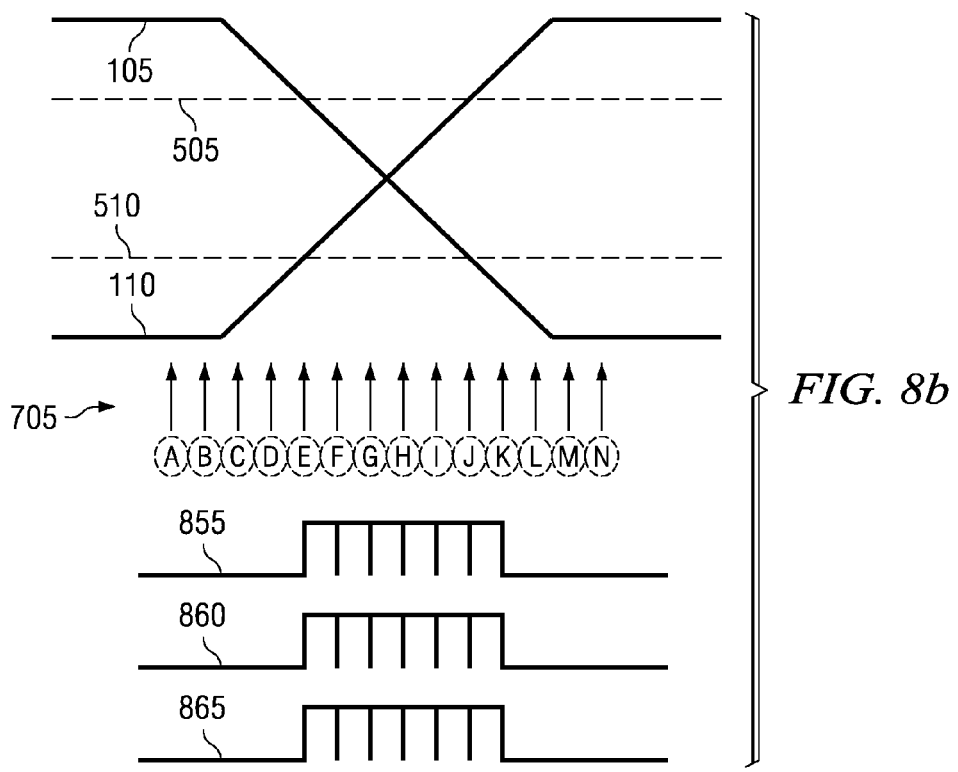

With reference now to FIGS. 8a and 8b, there are shown diagrams illustrating the effect of timing on the undersampling of an exemplary signal crossover of a DUT and a corresponding output signal from a test board from a test system such as shown in FIG. 6, according to a preferred embodiment of the present invention. FIG. 8a displays a situation wherein the signal 105 begins its signal crossover before the signal 110. Since the signal 105 begins its signal crossover before the signal 110 begins its signal crossover, a voltage value corresponding to when both signals 105 and 110 share a common voltage value is below a midpoint of the overall voltage swing. However, since the signal 105 did not begin its signal crossover too early, the voltage value remains within the boundaries set by the pair of dashed lines 505 and 510.

A sequence of impulses 705 represents sampling instances in time while a first sequence of data pulses 805 represents an output of a window comparator (such as window comparator 400 (FIG. 6)) used to compare the signal 105 with the boundaries set by the pair of dashed lines 505 and 510. A second sequence of data pulses 810 represents an output of a window comparator (such as window comparator 400 (FIG. 6)) used to compare the signal 110 with the boundaries set by the pair of boundaries set by the pair of dashed lines 505 and 510. Note that since the signal crossovers of the signals 105 and 110 are skewed, the respective sequences of data pulses are also skewed. The first sequence of data pulses 805, corresponding to the signal 105, has a series of logic true values corresponding to impulses labeled E, F, G, H, and I, while the second sequence of data pulses 810, corresponding to the signal 110, has a series of logic true values corresponding to impulses labeled G, H, I, J, and K. A third sequence of data pulses 815 representing an output of a latch (such as the latch 629 (FIG. 6)) and represents a logical ANDing of the first sequence of data pulses 805 with the second sequence of data pulses 810. The third sequence of data pulses 815 has a series of logic true values corresponding to impulses labeled G, H, and I.

FIG. 8b displays a situation wherein the signal 105 begins its signal crossover at substantially the same time when the signal 110 begins its signal crossover. As a result, a fourth sequence of data pulses 855 representing an output of a window comparator (such as window comparator 400 (FIG. 6)) used to compare the signal 105 with the boundaries set by the pair of dashed lines 505 and 510 is similar to a fifth sequence of data pulses 860 representing an output of a window comparator (such as window comparator 400 (FIG. 6)) used to compare the signal 110 with the boundaries set by the pair of dashed lines 505 and 510. Furthermore, a sixth sequence of data pulses 865 representing an output of a latch (such as the latch 629 (FIG. 6)) and corresponding to a logical ANDing of the fourth sequence of data pulses 855 with the fifth sequence of data pulses 860 is similar to the fourth sequence of data pulses 855 and the fifth sequence of data pulses 860.

A comparison of the third sequence of data pulses 815 with the sixth sequence of data pulses 865 can reveal that the sixth sequence of data pulses 865 has a greater number of data pulses with a logic true value. This can be an indication that when a pair of signals crosses over at substantially the same time, the pair of signals spends a greater amount of time within the boundaries set by the dashed lines 505 and 510. It can be shown that a maximum number of data pulses with a logic true value occurs when the pair of signals crosses over at the same time and the number of data pulses with a logic true value decreases as a difference in time between the pair of signals crossing over increases.

Figures 9, 10:
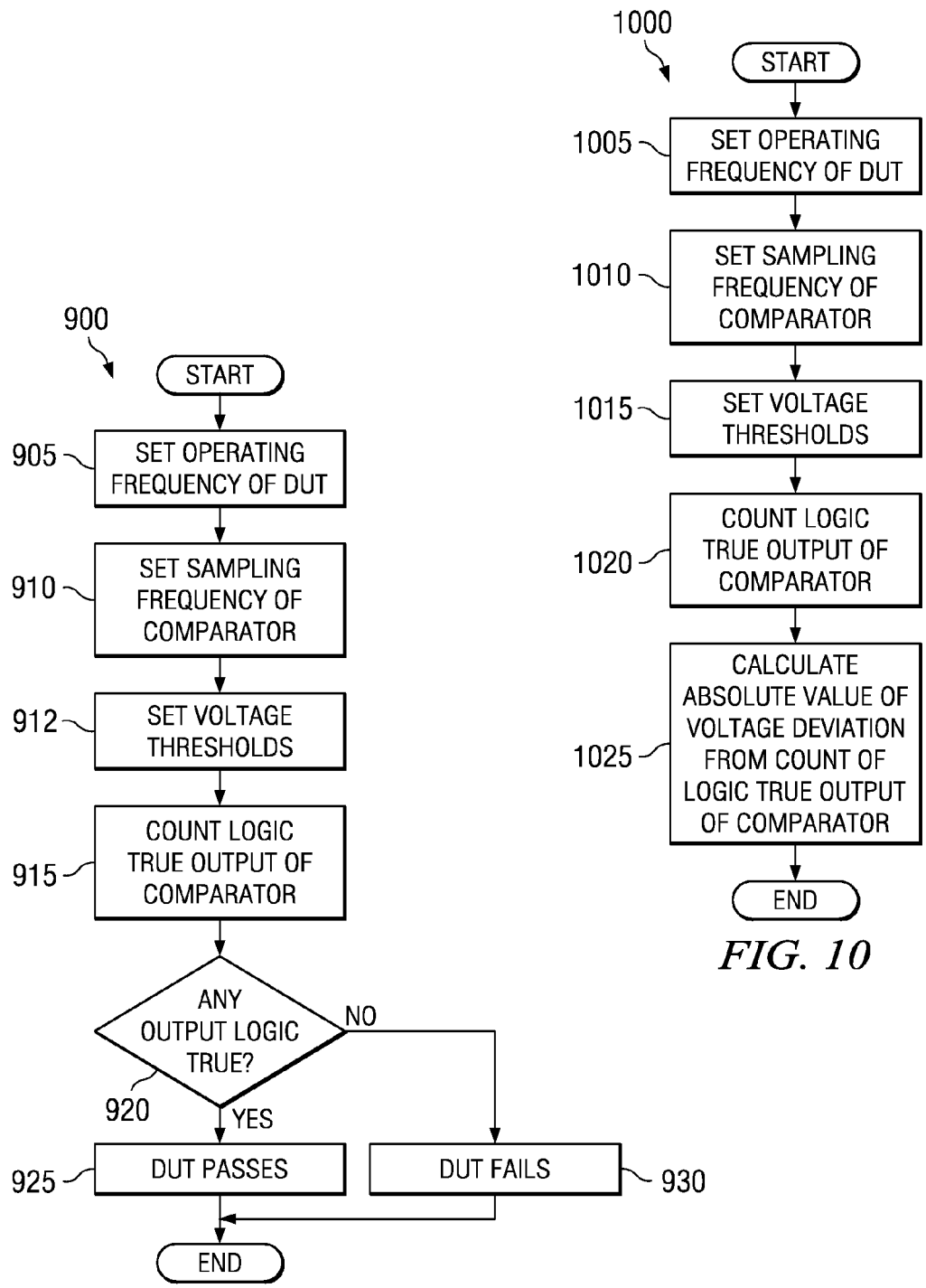
FIG. 9 is an algorithm for determining if a DUT passes or fails signal crossover timing constraints, according to a preferred embodiment of the present invention.
FIG. 10 is an algorithm for determining an absolute value of a voltage deviation, according to a preferred embodiment of the present invention.

With reference now to FIG. 9, there is shown a flow diagram illustrating an algorithm 900 for determining if a DUT passes or fails signal crossover testing based upon a set of technical specifications, according to a preferred embodiment of the present invention. As discussed previously, a technical specification concerning a timing involved in a signal crossover for a differential mode signal can be converted into a voltage specification. It can then be possible to make use of an undersampling comparator to determine if a DUT, such as the DUT 605 (FIG. 6), meets the technical specifications. According to a preferred embodiment of the present invention, the algorithm 900 can execute in an ATE, such as the ATE 615 (FIG. 6). The ATE 615 can feature a processor, a processing element, a controller, or even a computer that can be used to execute programs, scripts, and so forth to configure, setup, and perform various tests on the DUT.

The ATE 615 can begin by setting an operating frequency for the DUT 605 (block 905). This can be achieved by placing the DUT 605 into a test mode and perhaps setting certain configuration variables and settings. Furthermore, the ATE 615 can provide a clock signal, for example, the second clock signal "CLOCK 2" 619 (FIG. 6), that can help set the operating frequency of the DUT 605. The ATE 615 can then set the sampling frequency of the undersampling comparator, which can be part of the test board 625 (FIG. 6) (block 910). Once again, the ATE 615 can set the sampling frequency of the undersampling comparator by controlling the frequency of a clock signal that it is providing to the undersampling comparator, for example, the first clock signal "CLOCK 1" 617 (FIG. 6).

Once the operating frequencies of the DUT 605 and the undersampling comparator have been set, the ATE 615 can set voltage thresholds (block 912). As discussed previously, the voltage threshold can be related to timing constraints placed on the signal crossover by technical specifications. The voltage thresholds can be defined by an upper voltage threshold and a lower voltage threshold, such as the dashed lines 505 and 510 (FIG. 5a). With the voltage thresholds set, the testing can commence. The ATE 615 can then count a number of logic true values in the output of the undersampling comparator (block 915). The ATE 615 can perform the count of the output signal produced by the undersampling comparator while it is operating or the ATE 615 can store the output signal (either in analog form, digital form, or time domain form) and then process the stored output signal after testing is complete. The ATE 615 can check to see if the output signal contains any logic true values (block 920). If there are logic true values, then the DUT 605 has passed the signal crossover test (block 925), while if there are no logic true values, then the DUT 605 has failed the signal crossover test (block 930). The algorithm 900 then terminates, to be repeated if there is additional testing to be performed.

Note that the above discussion references the test system 600 (FIG. 6) and as shown in FIG. 6, a logic true value on an output of the latch 629 indicates that a signal crossover successfully meets technical constraints. However, it is possible to alter the design of the test system 600 so that a logic false value can be an indicator of a DUT passing the signal crossover test. Additionally, the discussion of FIG. 8a shows that if the pair of signals do not begin their signal crossovers at substantially the same time, a number of logic true values may not be at a maximum. Therefore, if the ATE 615 maintains a history of results from previous testing, the ATE 615 can possibly determine a quality rating of how well a DUT passes (or fails) the signal crossover testing. For example, if previous testing shows that for a DUT that exceeds the technical constraints by a large margin has a latch output containing a string of five consecutive logic true values, then the ATE 615 can determine that a DUT that has a latch output containing a string of two consecutive logic true values may only marginally pass the technical constraints. This DUT can be marked for additional testing.

In addition to simply testing a DUT for passing or failing a technical constraint, the undersampling comparator can be used to obtain a measure of how well the DUT is actually performing. For example, the undersampling comparator can be used to determine an approximation of an absolute value of the voltage value where the pair of signals shares a common voltage value. Additionally, the undersampling comparator can be used to obtain an approximation of the actual value of the voltage value where the pair of signals shares the common voltage value.

With reference now to FIG. 10, there is shown a flow diagram illustrating an algorithm 1000 for use in determining an approximation of an absolute value of a voltage deviation of the voltage value where the pair of signals in a differential mode signal shares a common voltage value, according to a preferred embodiment of the present invention. Rather that simply determining if a DUT passes or fails the technical constraint, the algorithm 1000 can be used to obtain an estimate of an absolute value of the voltage value wherein the pair of signals in a differential mode signal shares a common voltage value (common voltage value). By obtaining an estimate of the absolute value of the common voltage value, the ATE 615 can obtain a measure of the performance of the DUT.

The ATE 615 can begin by setting the operating frequency of the DUT (block 1005) and the sampling frequency of the undersampling comparator (block 1010). After setting the operating frequency of the DUT and setting the sampling frequency of the undersampling comparator, the ATE 615 can then set an upper voltage threshold and a lower voltage threshold for the undersampling comparator (block 1015). The upper voltage threshold and the lower voltage thresholds are displayed as dashed horizontal lines, such as the dashed lines 505 and 510 in FIG. 5a. According to a preferred embodiment of the present invention, a tighter voltage boundary (as specified by the upper voltage threshold and the lower voltage threshold) can result in a more accurate estimate. However, an overly tight voltage boundary may not be able to estimate the common voltage value on a DUT with a common voltage value that is widely different from normal.

After setting the upper voltage threshold and the lower voltage threshold, the ATE 615 can initiate the testing and the ATE 615 can either count the logic true values from the output of the undersampling comparator or it can store the output of the undersampling comparator for later processing (block 1020). According to a preferred embodiment of the present invention, a count of consecutive logic true values can provide an indicator of a relative position of the common voltage value in relation to the voltage boundary. If the common voltage value is substantially in the middle of the voltage boundary, then the count of consecutive logic true values is maximized and as the common voltage value moves away from the middle of the voltage boundary (either upwards or downwards), the count of consecutive logic true values decreases. An actual maximum value for the count of consecutive logic values can be dependent upon the size of the voltage boundary, the sampling rate, the rate of change of the signals in the signal crossover, and so forth. With a count of the logic true values (either from an immediate count or from subsequent counting), the ATE 615 is able to calculate an estimate of the absolute value of the common voltage value for the DUT (block 1025). The ATE 615 can calculate the estimate by using historical information from previously tested DUTs that have been stored in the ATE 615. The historical information can be arranged in a look-up table and based upon voltage boundary size, since the size of the voltage boundary can affect the count of consecutive logic true values. Using the look-up table and a count of consecutive logic true values, the ATE 615 can readily provide an estimate of the absolute value of the common voltage value. After calculating the estimate, the ATE 615 can terminate the execution of the algorithm 1000.

Figure 11A:
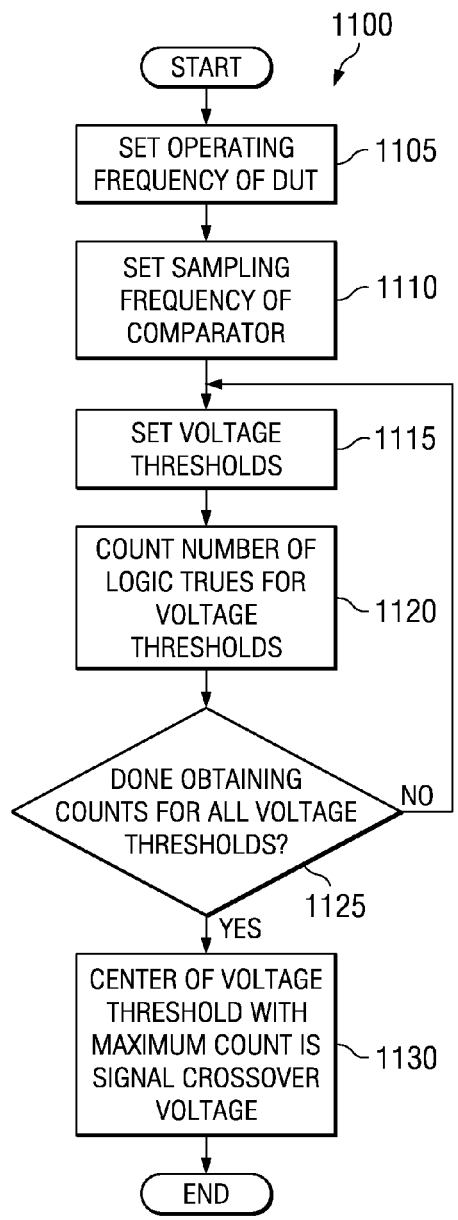
FIGS. 11a and 11b are algorithms for determining an approximation of a common voltage value, according to a preferred embodiment of the present invention.
Figure 11B:
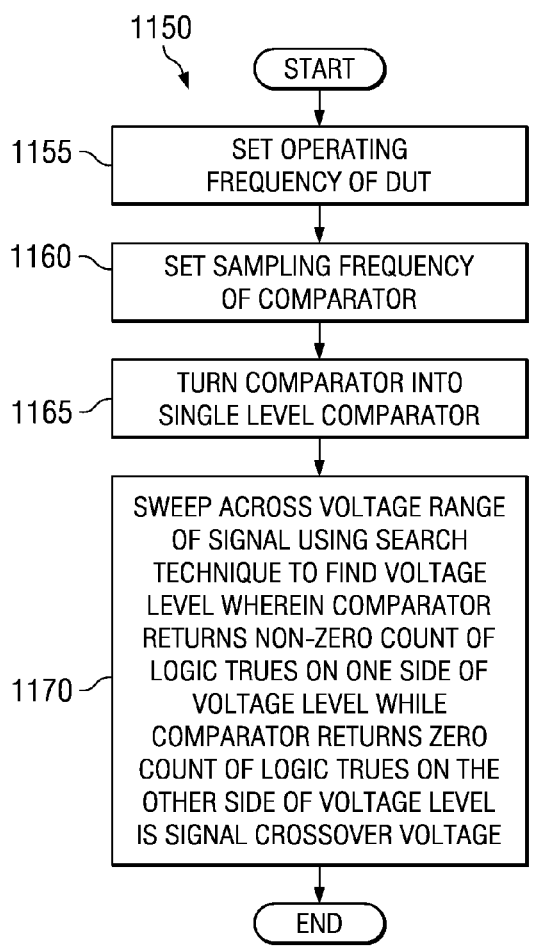

With reference now to FIGS. 11a and 11b, there are shown flow diagrams illustrating two exemplary algorithms for use in determining an approximation of the voltage value where the pair of signals in a differential mode signal shares a common voltage, according to a preferred embodiment of the present invention. FIGS. 11a and 11b describe two different algorithms for determining an approximation of the common voltage value, algorithm 1100 (FIG. 11a) uses a linear scan of an entire voltage range to determine the approximation while algorithm 1150 (FIG. 11b) uses an advanced search technique that can reduce the number of voltage ranges searched to determine the approximation.

According to a preferred embodiment of the present invention, the algorithm 1100 can be executed in the ATE 615 on a processor, processing element, computer, or so on. The ATE 615 can begin by setting an operating frequency for a DUT (block 1105) and a sampling frequency for an undersampling comparator (block 1110). The ATE 615 can then set an upper voltage threshold and a lower voltage threshold (block 1115). According to a preferred embodiment of the present invention, a narrower boundary (as specified by the upper voltage threshold and the lower voltage threshold) can result in a more accurate estimate of the common voltage value. However, too narrow of a boundary can result in a longer test time without providing a significantly more accurate estimate.

After setting the upper voltage threshold and the lower voltage threshold (block 1115), the ATE 615 can initiate testing and count a number of logic true values resulting from the specified boundary (block 1120). As described previously, the ATE 615 can count the number of logic true values as they are being generated or the ATE 615 can store the results of the testing and then perform the counting after the testing is complete. After completing the testing with the specified boundary, the ATE 615 can check to determine if it has performed the testing with all desired voltage thresholds (block 1125). If the ATE 615 has not performed the test with all desired voltage thresholds, then the ATE 615 can return to block 1115 to set a different upper voltage threshold and lower voltage threshold and repeat the testing. The ATE 615 can repeat the testing until all desired voltage threshold have been tested. After the ATE 615 has performed testing for all desired voltage thresholds, the ATE 615 can determine the estimate of the common voltage value by selecting a voltage threshold with a largest number of consecutive logic true values (block 1130). According to a preferred embodiment of the present invention, the common voltage value can be a value at the middle of the selected voltage threshold. If there are several voltage thresholds with the same number of consecutive logic true values, then the estimate of the common voltage value can be an average of the midpoints of the voltage thresholds. The averaging can apply equal weight to each voltage threshold or greater weight can be applied to the voltage thresholds that are closer to the middle of the overall voltage range. Alternatively, the estimate of the common voltage value may be the midpoint of the voltage threshold that is closest to the middle of the overall voltage range.

The algorithm 1150 uses a more sophisticated search technique to potentially help decrease testing time when determining the common voltage value. The algorithm 1150 can be executed in the ATE 615 on a processor, processing element, computer, or so on. The ATE 615 can begin by setting an operating frequency for a DUT (block 1155) and a sampling frequency for an undersampling comparator (block 1160). The ATE 615 can then configure the undersampling comparator so that it becomes a single level comparator (block 1165). The ATE 615 can do this by setting either the upper voltage threshold to a maximum voltage value in the overall voltage range, such as VDD, or the lower voltage threshold to a minimum voltage value in the overall voltage range, such as zero (0). According to a preferred embodiment of the present invention, the voltage threshold not set to the maximum voltage value or the minimum voltage value can be set to a voltage value equal to the middle of the overall voltage range. By doing so, the undersampling comparator effectively becomes a single level comparator, comparing an input voltage signal against a single voltage threshold (either the lower voltage threshold or the upper voltage threshold) and producing results based on the single threshold.

The ATE 615 can then use a sophisticated search technique, such as a binary search, to sweep across the overall voltage range (specifying the voltage thresholds) and perform counts of logic true values at each voltage threshold (block 1170). After performing a count of logic true values at a voltage threshold, the ATE 615 can determine the next voltage threshold to test based upon the value of the count. The ATE 615 can use the binary search technique to find a voltage threshold wherein a count of logic true values for voltage values above (below) the voltage threshold is non-zero while a count of logic true values for voltage values below (above) the voltage threshold is zero. This voltage threshold can be referred to as a dividing threshold. The binary search technique is considered to be well understood by those of ordinary skill in the art of the present invention and will not be discussed herein. Alternatively, the ATE 615 can use a linear search, wherein the ATE 615 can move the voltage threshold from one end of the voltage range to the other end of the voltage range to determine the dividing threshold.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test circuit for testing a signal crossover in a differential mode signal, the test circuit comprising:
    a pair of window comparators, each window comparator coupled to a signal from a pair of signals making up the differential mode signal, each window comparator being configured to compare a value of the signal with a voltage threshold boundary and produce an output value based on the comparison; and
    an enable signal line coupled to the pair of window comparators, the enable signal line to provide an enable signal to initiate the comparison in the window comparators, wherein the enable signal is periodic with a period that is substantially equal to an integer multiple of a period of the signal crossover plus a small time value.

2. The test circuit of claim 1, wherein each window comparator outputs a logic true value if the value of the signal is within the voltage threshold boundary.

3. The test circuit of claim 1 further comprising a logic circuit having inputs coupled to the pair of window comparators, the logic circuit is configured to combine the output values from the window comparators.

4. The test circuit of claim 3, wherein the logic circuit is a logical AND gate.

5. The test circuit of claim 3 further comprising a latch coupled to the logic circuit and the enable signal line, the latch is configured to capture a value at an output of the logic circuit when initiated by the signal on the enable signal line.

6. The test circuit of claim 5, wherein the latch is a D-type flip flop.

7. The test circuit of claim 1, wherein the voltage threshold boundary comprises an upper voltage threshold and a lower voltage threshold, and wherein the upper voltage threshold and the lower voltage threshold correspond to a timing constraint on the signal crossover.

8. The test circuit of claim 7, wherein the upper voltage threshold and the lower voltage threshold are functions of the timing constraint on the signal crossover and a slew rate of the signal crossover.

9. The test circuit of claim 1, wherein the small time value is much smaller than the period of the signal crossover.

10. The test circuit of claim 1, wherein the small time value can be either positive or negative.

11. A test system comprising:
    a test circuit operable to be coupled to a device under test (DUT), the test circuit configured to test a signal crossover for a differential mode signal provided by the DUT, wherein the test circuit comprises,
        a pair of window comparators, each window comparator coupled to a signal from a pair of signals making up the differential mode signal, each window comparator configured to compare a value of the signal with a voltage threshold boundary and produce an output value based on the comparison;
        an enable signal line coupled to the pair of window comparators, the enable signal line to provide an enable signal to initiate the comparison in the window comparators, wherein the enable signal is periodic with a period that is substantially equal to an integer multiple of a period of the signal crossover plus a small time value; and
    an automatic test equipment (ATE) coupled to the DUT and the test circuit, the ATE configured to provide clock signals to the DUT and an enable signal to the test circuit and process data produced by the test circuit.

12. The test system of claim 1, wherein the test circuit further comprises:
    a logic circuit having inputs coupled to the pair of window comparators, the logic circuit configured to combine the output values from the window comparators; and
    a latch coupled to the logic circuit and the enable signal line, the latch configured to capture a value at an output of the logic circuit when initiated by the signal on the enable signal line.

13. The test system of claim 11, wherein the ATE comprises:
    a data capture equipment coupled to the test circuit, the data capture equipment configured to capture and save data provided by the test circuit;
    a first clock coupled to the enable signal line and the data capture equipment, the first clock to provide clock signals at a first frequency, wherein clock signals provided by the first clock are used to initiate operation of the pair of window comparators and the data capture equipment;
    a second clock coupled to the DUT, the second clock to provide clock signals at a second frequency, wherein the first frequency is substantially equal to an integer multiple of the second clock plus the small time difference; and a reference clock coupled to the first clock and the second clock, the reference clock configured to help prevent clock drift between the first clock and the second clock.

14. The test system of claim 11, wherein the voltage threshold boundary comprises an upper voltage threshold and a lower voltage threshold, wherein the upper voltage threshold and the lower voltage threshold correspond to a timing constraint on the signal crossover, and wherein the ATE counts a number of times that both signals making up the differential mode signal are within the voltage threshold boundary.

15. The test system of claim 14, wherein the test system is used to determine if the DUT passes a timing constraint for signal crossover, and wherein if the count performed by the ATE is non-zero, then the DUT passes the timing constraint for signal crossover.

16. The test system of claim 11, wherein the small time value can be either positive or negative.

17. A method for testing a circuit for meeting signal crossover timing constraints, the method comprising:
setting an operating frequency of the circuit and a sampling frequency of an undersampling comparator, wherein the sampling frequency of the undersampling comparator is substantially equal to an integer multiple of the operating frequency of the circuit plus a small frequency value;
setting a voltage threshold based upon a timing constraint;
initiating the testing of the circuit; and
counting a number of times an output of the undersampling comparator is equal to a specified value.

18. The method of claim 17, wherein the undersampling comparator produces a logic true value when two signals making up a differential mode signal at its input are within a voltage boundary, and wherein the circuit passes the signal crossover timing constraints test if the number of times the output is equal to the specified value is non-zero.

19. The method of claim 18, wherein the voltage boundary is specified by an upper voltage threshold and a lower voltage threshold, and wherein the upper voltage threshold and the lower voltage threshold are dependent upon the timing constraints and a slew rate of the two signals.

20. The method of claim 17 further comprising after the counting, calculating an absolute value of a voltage deviation from a midpoint of a voltage range.

21. The method of claim 20, wherein the calculating comprises:

comparing the count of the number of times the output is equal to the specified value to a known maximum value;
computing the absolute value of the voltage deviation if the count is less than the known maximum; and
setting the absolute value of the voltage deviation to zero if the count is equal to the known maximum.

22. The method of claim 21, wherein the known maximum is calculated based upon a size of a voltage boundary used by the undersampling comparator, a slew rate of a differential mode signal produced by the circuit, and the sampling rate of the undersampling comparator.

23. The method of claim 17, wherein the small frequency value can be either positive or negative.

24. A method for measuring a crossover voltage of a differential mode signal produced by a circuit, the method comprising:
setting an operating frequency of the circuit and a sampling frequency of an undersampling comparator, wherein the sampling frequency of the undersampling comparator is substantially equal to an integer multiple of the operating frequency of the circuit plus a small frequency value;
setting a voltage threshold for the undersampling comparator;
counting a number of times an output of the undersampling comparator is equal to a specified value;
repeating the second setting and the counting for any remaining voltage thresholds; and
calculating the crossover voltage from a voltage threshold with a largest count of the number of times the output of the undersampling comparator is equal to the specified value.

25. The method of claim 24, wherein the calculating comprises setting the crossover voltage to a midpoint of the voltage threshold with a largest count of the number of times the output of the undersampling comparator is equal to the specified value.

26. The method of claim 25, wherein if there are multiple voltage thresholds with counts equal to the largest count of the number of times the output of the undersampling comparator is equal to the specified value, then the calculating comprises setting the crossover voltage to an average of the midpoints of the voltage thresholds.

27. The method of claim 24, wherein the small frequency value can be either positive or negative.

* * * * *